US010297718B2

(12) United States Patent
Chung et al.

(10) Patent No.: US 10,297,718 B2
(45) Date of Patent: May 21, 2019

(54) LIGHT-EMITTING DEVICE

(71) Applicant: EPISTAR CORPORATION, Hsinchu (TW)

(72) Inventors: Wei-Jung Chung, Hsinchu (TW); Jennhwa Fu, Hsinchu (TW); Cheng-Hsien Li, Hsinchu (TW); Chi-Hao Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/294,256

(22) Filed: Oct. 14, 2016

(65) Prior Publication Data

US 2017/0033265 A1 Feb. 2, 2017

Related U.S. Application Data

(63) Continuation of application No. 14/301,492, filed on Jun. 11, 2014, now abandoned.

(30) Foreign Application Priority Data

| Jun. 20, 2013 | (TW) | 102122124 A |
| Apr. 28, 2014 | (TW) | 103115304 A |

(51) Int. Cl.
| *H01L 33/38* | (2010.01) |
| *H01L 25/075* | (2006.01) |
| *H01L 33/20* | (2010.01) |

(52) U.S. Cl.
CPC ........ *H01L 33/387* (2013.01); *H01L 25/0753* (2013.01); *H01L 33/38* (2013.01);
(Continued)

(58) Field of Classification Search
CPC ....... H01L 33/00; H01L 33/36; H01L 33/486; H01L 33/62; H01L 27/153; H01L 25/0753; H01L 33/382; H01L 33/24; H01L 31/153
See application file for complete search history.

(56) References Cited

U.S. PATENT DOCUMENTS

| 6,828,596 B2 | 12/2004 | Steigerwald et al. |
| 7,985,976 B2 | 7/2011 | Choi et al. |

(Continued)

FOREIGN PATENT DOCUMENTS

| JP | 2004281581 A | 10/2004 |
| JP | 2006148087 A | 6/2006 |

(Continued)

*Primary Examiner* — Eric A. Ward
*Assistant Examiner* — Eric K Ashbahian
(74) *Attorney, Agent, or Firm* — Patterson + Sheridan, LLP

(57) ABSTRACT

A light-emitting device includes a substrate including an upper surface; a light-emitting stack including a first semiconductor layer, a second semiconductor layer, and an active layer between the first semiconductor layer and the second semiconductor layer, wherein the light-emitting stack includes a first surface and a second surface opposite to the first surface toward to the upper surface; a plurality of depressions formed in the light-emitting stack and penetrating the second semiconductor layer, the active layer and a portion of the first semiconductor layer; an insulative layer covering the second surface of the light-emitting stack; a connector including a first portion and a second portion; and an electrode disposed at a side of the light-emitting stack and electrically connecting the connector, wherein the first portion of the connector is formed in the plurality of depressions, the second portion of the connector is between the insulative layer and the light-emitting stack.

6 Claims, 13 Drawing Sheets

(52) U.S. Cl.
CPC ............ *H01L 33/382* (2013.01); *H01L 33/20* (2013.01); *H01L 2924/0002* (2013.01)

(56) References Cited

U.S. PATENT DOCUMENTS

| | | | |
|---|---|---|---|
| 8,008,683 B2 | 8/2011 | Choi et al. | |
| 8,476,663 B2* | 7/2013 | Horng | H01L 33/0079 257/98 |
| 2008/0191215 A1 | 8/2008 | Choi et al. | |
| 2009/0029031 A1* | 1/2009 | Lowrey | H01L 45/06 427/58 |
| 2010/0078656 A1* | 4/2010 | Seo | H01L 27/156 257/88 |
| 2010/0171135 A1 | 7/2010 | Engl et al. | |
| 2010/0308347 A1 | 12/2010 | Yeh et al. | |
| 2011/0049537 A1* | 3/2011 | Lee | H01L 25/0753 257/88 |
| 2011/0073838 A1* | 3/2011 | Khan | H01L 27/153 257/13 |
| 2011/0140078 A1* | 6/2011 | Hsu | H01L 25/0753 257/13 |
| 2011/0169040 A1 | 7/2011 | Seo et al. | |
| 2011/0233587 A1 | 9/2011 | Unno | |
| 2011/0260205 A1 | 10/2011 | Moosburger et al. | |
| 2012/0018763 A1 | 1/2012 | Engl et al. | |
| 2012/0018764 A1* | 1/2012 | Choi | H01L 33/20 257/99 |
| 2012/0049218 A1* | 3/2012 | Horng | H01L 33/0079 257/98 |
| 2012/0074441 A1 | 3/2012 | Seo et al. | |
| 2012/0126259 A1 | 5/2012 | Mizutani et al. | |
| 2012/0168715 A1* | 7/2012 | Horng | H01L 27/153 257/13 |
| 2012/0199861 A1* | 8/2012 | Tsuji | H01L 33/405 257/98 |
| 2013/0113007 A1 | 5/2013 | Choi | |
| 2013/0119424 A1 | 5/2013 | Kang et al. | |
| 2013/0207156 A1* | 8/2013 | Moosburger | H01L 27/15 257/99 |
| 2013/0228744 A1* | 9/2013 | Kazama | H01L 33/382 257/13 |
| 2014/0306247 A1* | 10/2014 | Lee | H01L 33/387 257/88 |

FOREIGN PATENT DOCUMENTS

| | | |
|---|---|---|
| JP | 2008041839 A | 2/2008 |
| JP | 2009260316 A | 11/2009 |
| JP | 2012084779 A | 4/2012 |
| JP | 2012218753 A | 11/2012 |
| JP | 2013098516 A | 5/2013 |
| JP | 2013201411 A | 10/2013 |
| TW | 200905910 A | 2/2009 |
| TW | 201014004 A | 4/2010 |
| TW | 201123539 A | 7/2011 |
| TW | 201212261 A | 3/2012 |
| TW | 201212287 A | 3/2012 |
| WO | 03044872 A1 | 5/2003 |
| WO | 2013092304 A1 | 6/2013 |

* cited by examiner

LIGHT-EMITTING DEVICE

REFERENCE TO RELATED APPLICATION

This application is a continuation application of U.S. patent application Ser. No. 14/301,492, filed on Jun. 11, 2014, now pending, which claims the right of priority based on TW application Serial No. 102122124, filed on Jun. 20, 2013 and Serial No. 103115304, filed on, Apr. 28, 2014, and the contents of which are hereby incorporated by reference in their entireties.

TECHNICAL FIELD

The disclosure is related to a light-emitting device, and more particularly, a light-emitting device and a light-emitting array with a connecting layer between a substrate and a light-emitting stack.

DESCRIPTION OF THE RELATED ART

The lighting theory of light-emitting diodes (LEDs) is that electrons move between an n-type semiconductor and a p-type semiconductor to release energy. Due to the difference of lighting theories between LEDs and incandescent lamps, the LED is called "cold light source". An LED has the advantages of good environment tolerance, a long service life, portability, and low power consumption and is regarded as another option for the lighting application. LEDs are widely adopted in different fields, for example, traffic lights, backlight modules, street lights, and medical devices and replaces conventional light sources gradually.

An LED has a light-emitting stack which is epitaxially grown on a conductive substrate or an insulting substrate. The so-called "vertical LED" has a conductive substrate and includes an electrode formed on the top of a light emitting layer; the so-called "lateral LED" has an insulative substrate and includes electrodes formed on two semiconductor layers which have different polarities and exposed by an etching process. The vertical LED has the advantages of small light-shading area for electrodes, good heat dissipating efficiency, and no additional etching epitaxial process, but has a shortage that the conductive substrate served as an epitaxial substrate absorbs light easily and is adverse to the light efficiency of the LED. The lateral LED has the advantage of radiating light in all directions due to a transparent substrate used as the insulator substrate, but has shortages of poor heat dissipation, larger light-shading area for electrodes, and smaller light-emitting area caused by epitaxial etching process.

The abovementioned LED can further connects to/with other device for forming a light-emitting device. For a light-emitting device, the LED can connect to a carrier by a side of a substrate or by soldering material/adhesive material between a sub-carrier and the LED.

SUMMARY OF THE DISCLOSURE

A light-emitting device includes a substrate including an upper surface; a light-emitting stack including a first semiconductor layer, a second semiconductor layer, and an active layer between the first semiconductor layer, and the second semiconductor layer, wherein the light-emitting stack includes a first surface and a second surface opposite to the first surface toward to the upper surface; a plurality of depressions formed in the light-emitting stack and penetrating the second semiconductor layer, the active layer and a portion of the first semiconductor layer; an insulative layer covering the second surface of the light-emitting stack; a connector including a first portion and a second portion; and an electrode disposed near a side of the light-emitting stack and electrically connecting the connector, wherein the first portion of the connector is formed in the plurality of depressions, and the second portion of the connector is between the insulative layer and the light-emitting stack.

A light-emitting device includes a substrate including an upper surface; a plurality of light-emitting units disposed on the upper surface of the substrate, wherein each of the light-emitting units includes a first surface and a second surface opposite to the first surface toward to the upper surface; a plurality of depressions disposed between adjacent two of the plurality of light-emitting units respectively; a first insulative layer between the substrate and the plurality of light-emitting units and covering the second surface of each of the plurality of light-emitting units; a connector including a first portion and a second portion; and a first electrode disposed near a side of the substrate and electrically connecting the connector, wherein the first portion of the connector is formed in the plurality of depressions, and the second portion of the connector is between the first insulative layer and the plurality of light emitting units, wherein the plurality of light-emitting units are connected in series, parallel or inverse-parallel via the connector.

A light-emitting device includes a light-emitting stack including a first semiconductor layer, a second semiconductor layer, and an active layer between the first semiconductor layer and the second semiconductor layer, wherein the first semiconductor layer includes a first surface, a second surface opposite to the first surface, a first portion connecting to the first surface, and a second portion connecting to the first portion; an opening penetrating the first portion of the first semiconductor layer from the first surface and having a first width; a depression connecting to the opening and penetrating the second semiconductor layer, the active layer, and the second portion of the first semiconductor layer, wherein the depression has a second width greater than the first width and includes a bottom to expose the second surface; an electrode located in the depression and corresponding to the opening; a barrier disposed on the second semiconductor layer; and an insulative structure having an upper portion disposed on a bottom portion, the bottom portion bounding the depression circumscribing the electrode, wherein an upper surface of the barrier is substantially coplanar with an upper surface of the upper portion of the insulative structure, wherein a material of the barrier is different from a material of the insulative structure, wherein the barrier horizontally circumscribes and in contact with the upper portion of the insulative structure, the bottom portion of the insulative structure circumscribing the electrode and extending below the barrier.

A light-emitting device includes a light-emitting stack including a first semiconductor layer, a second semiconductor layer, and an active layer between the first semiconductor layer and the second semiconductor layer, wherein the first semiconductor layer includes a first surface, a second surface opposite to the first surface, a first portion connecting to the first surface, and a second portion connecting to the first portion; an opening penetrating the first portion and having a first width; a depression connecting to the opening and penetrating the second semiconductor layer, the active layer, and the second portion of the first semiconductor layer, wherein the depression includes a second width wider than the first width, and the depression includes a bottom to expose the second surface; and an electrode located in the depression and corresponding to the opening.

A light-emitting array includes a substrate having an upper surface, light-emitting units on the upper surface of the substrate, wherein each of the light-emitting units includes a first surface and a second surface opposite to the first surface and toward to the upper surface; an insulative layer, between the substrate and the light-emitting unit, covering the second surface of each of the light-emitting units; and at least one of wires embedded in the insulative layer, wherein each of the at least one of wires includes a conductive channel, penetrating the insulative layer and electrically connecting with the second surface, and a bridge electrically connecting with the conductive channel, and at least one of the bridges electrically connects two of the light-emitting units via a plurality the conductive channels.

BRIEF DESCRIPTION OF THE DRAWING

The accompanying drawing is included to provide easy understanding of the application, and is incorporated herein and constitutes a part of this specification. The drawing illustrates the embodiment of the application and, together with the description, serves to illustrate the principles of the application.

DETAILED DESCRIPTION OF THE EMBODIMENTS

Figure 1A:
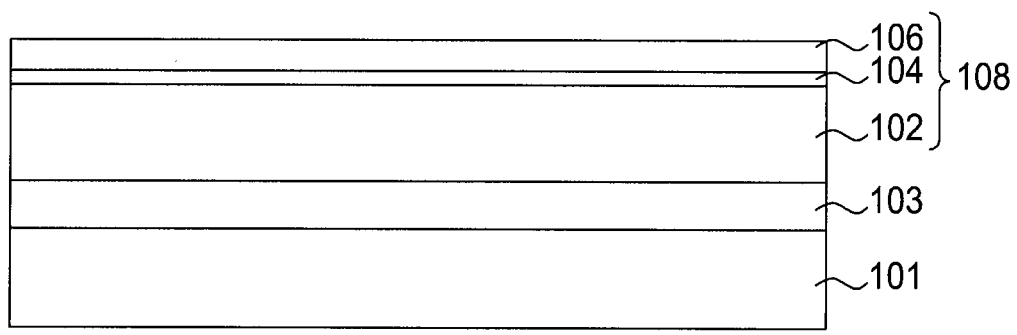
FIGS. 1A to 1H illustrate a light-emitting device in accordance with a manufacturing method of a first embodiment of the application.

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure in accordance with the drawing.

Referring to FIGS. 1A to 1H, the figures illustrate a light-emitting device in accordance with a manufacturing method of a first embodiment of the application. As shown in FIG. 1A, a light-emitting stack 108 which is epitaxially grown on a growth substrate 101 includes a first semiconductor layer 102, a second semiconductor layer 106, and an active layer 104 between the first semiconductor layer 102 and the second semiconductor layer 106. The light-emitting stack 108 can be a nitride light-emitting stack and a material of the light-emitting stack 108 containing elements like aluminum (Al), indium (In), gallium (Ga), or nickel (N). The growth substrate 101 can be made of a transparent insulative substrate, such as sapphire, or a conductive substrate, such as silicon (Si) substrate or silicon carbide (SiC) substrate. For reducing lattice mismatch between the growth substrate 101 and the light-emitting stack 108, a buffer layer 103 can be formed on the growth substrate 101 before forming the light-emitting stack 108. A material of the light-emitting stack 108 can contain elements like aluminum (Al), gallium (Ga), indium (In), phosphorus (P), or arsenic (As), and a material of the growth substrate 101 can be gallium arsenide (GaAs). The first semiconductor layer 102, the active layer 104, the second semiconductor layer 106 are epitaxially grown on the growth substrate 101. Herein, the first semiconductor layer 102 can be an n-type semiconductor, the second semiconductor layer 106 can be a p-type semiconductor, and a structure of the light-emitting stack 108 includes a single heterostructure (SH), a double-side double heterostructure (DDH), or multi-quantum well (MQW) structure.

Figure 1B:
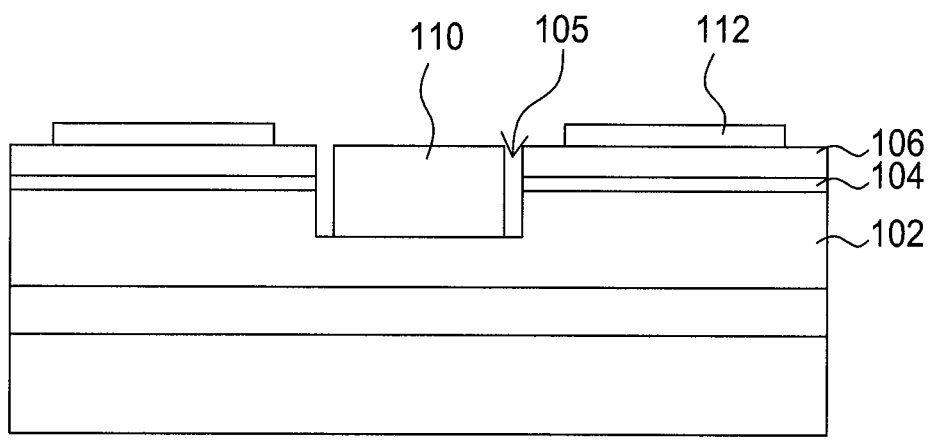

Referring to FIG. 1B, a depression 105 is formed, penetrates the second semiconductor layer 106 and the active layer 104, and exposes the first semiconductor layer 102. The depression 105 has a pattern and an electrode 110 which is corresponding to the pattern is formed in the depression 105. Afterwards, a conductive layer 112 is formed on the second semiconductor layer 106. Herein, the electrode 110 electrically connects with only the first semiconductor layer 102, and in a cross-sectional view, there is a gap between two sides of the electrode 110 and the depression 105 so the electrode 110 is insulated from the active layer 104 and the second semiconductor layer 106. The conductive layer 112 has ohmic contact with the second semiconductor layer 106 and can be a transparent conductive layer, such as indium tin oxide (ITO), indium zinc oxide (IZO) or aluminum-doped zinc oxide (A ZO), or metal material, such as, nickel (Ni), platinum (Pt), palladium (Pd), silver (Ag), or chromium (Cr). The electrode 110 can be aluminum (Al), titanium (Ti), chromium (Cr), platinum (Pt), gold (Au), or combinations thereof.

Figure 1C:
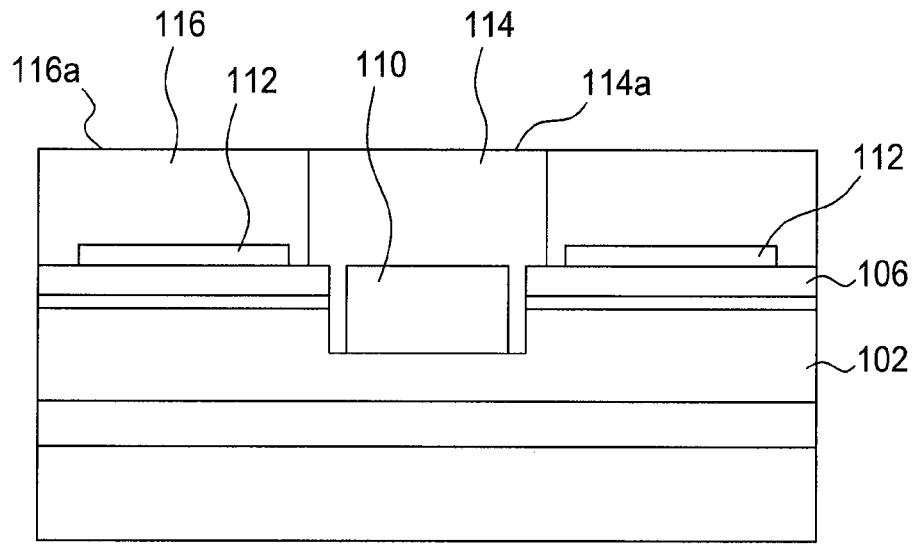

Referring to FIG. 1C, a barrier 116 covering the conductive layer 112 and an insulative structure 114 covering the electrode 110 are formed. The barrier 116 covers all surface of the conductive layer 112 except the region contacting the second semiconductor layer 106. The pattern of the insulative structure 114 is substantially corresponding to the pattern of the electrode 110 while the insulative structure 114 fills a space between the electrode 110 and the depression 105. The upper surface 114a of the insulative structure 114 and the upper surface 116a of the barrier 116 are coplanar and the barrier 116 horizontally surrounds the insulative structure 114, except the portion in the depression 105. The insulative structure 114 includes transparent material and is formed by evaporating, sputtering, or spin-on glass (SOG) to form single-layer of $SiO_2$, single-layer of $TiO_2$, or single-layer of $Si_3N_4$ and then solidifying. The barrier 116 can be single-layer or multi-layer structure and includes titanium (Ti), tungsten (W), platinum (Pt), titanium tungsten (TiW) or combinations thereof.

Figure 1D:
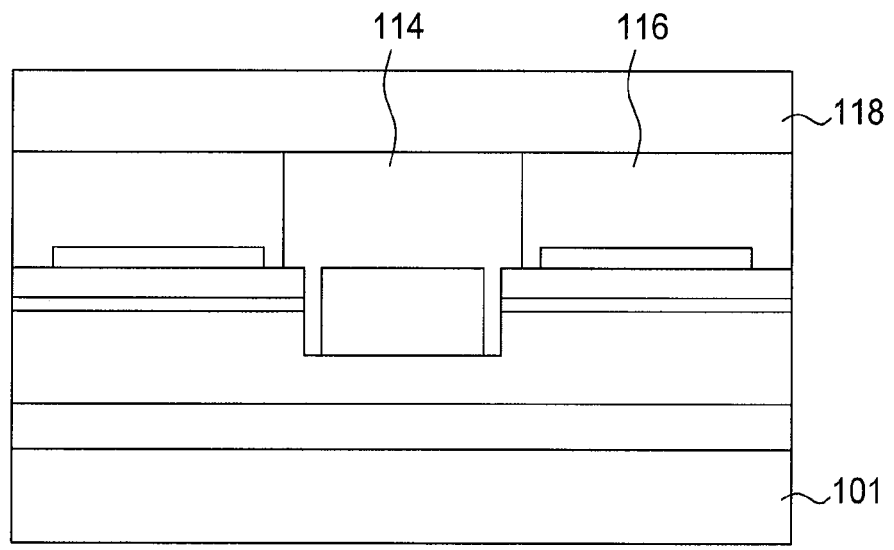

Referring to FIG. 1D, a reflective layer 118 is formed on a plane on which the upper surface 114a of the insulated layer 114 and the upper surface 116a of the barrier 116 lie. The reflective layer 118 can include aluminum (Al).

Figure 1E:
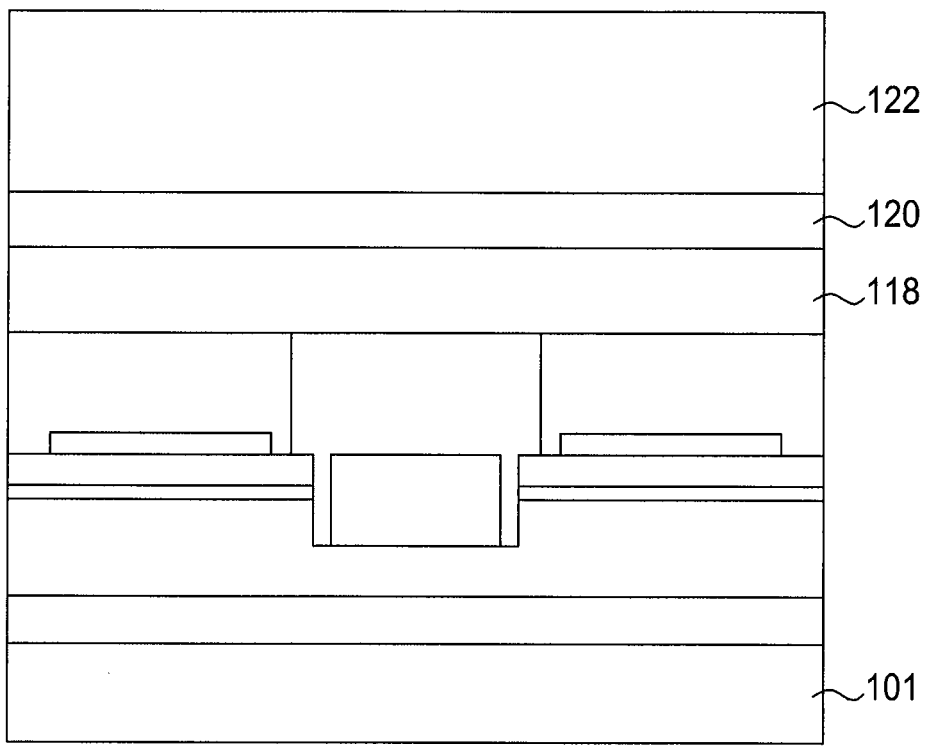

Referring to FIG. 1E, a conductive substrate 122 is provided and connects to a metal layer 118 via a joining structure 120. The joining structure 120 includes gold (Au), indium (In), nickel (Ni), titanium (Ti), or combinations thereof. Consequentially, a process of removing the growth substrate 101 is performed. The conductive substrate 122 includes a semiconductor material, such as silicon (Si), or a metal material, such as, cobalt (Cu), tungsten (W), or aluminum (Al). Moreover, a surface of the conductive substrate 122 can be graphene.

Figure 1F:
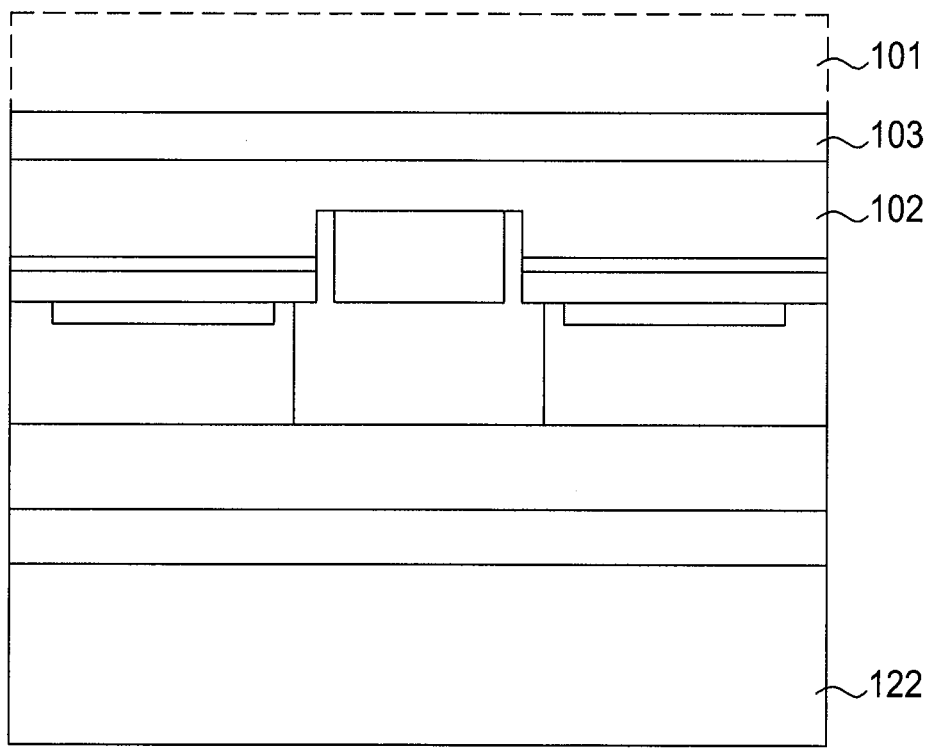

Referring to FIG. 1F, a laser ray (not shown in FIG. 1F) is provided to a back surface of the growth substrate 101 to dissolve a buffer layer 103 by energy from the laser ray. For example, when the buffer layer 103 is non-doped or unintentional-doped GaN, the energy from the laser ray can evaporate nitrogen in gallium nitride (GaN), so as to dissolve the buffer layer 103 and remove the growth substrate 101 so the first semiconductor 102 is exposed.

Figure 1G:
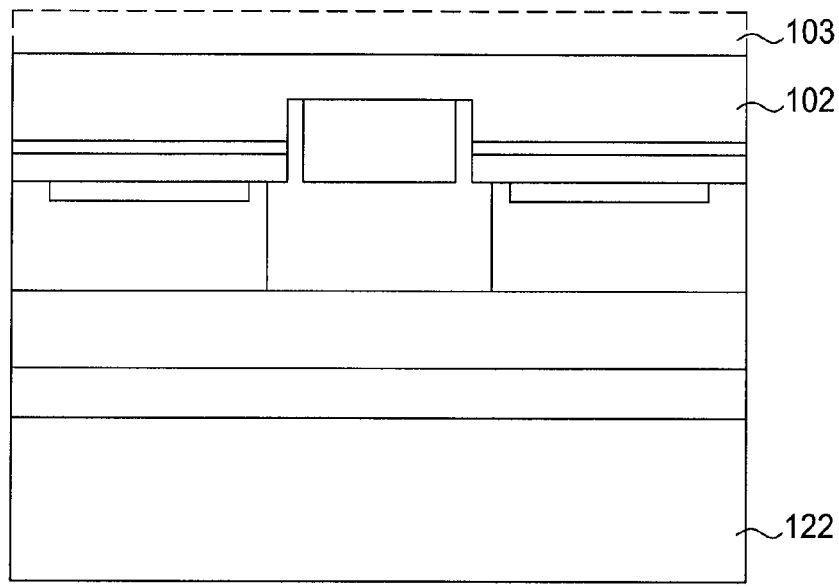

Referring to FIG. 1G, the remaining buffer layer 103 on the first semiconductor layer 102 is further removed. When the buffer layer 103 is non-doped or unintentional-doped gallium nitride, because the nitrogen in gallium nitride has been evaporated in the abovementioned process by the laser ray, a cleaning step is performed to mainly remove the remaining gallium in the step by inductively coupled plasma (ICP), and the surface of the first semiconductor layer can be further cleaned by HCl or $H_2O_2$.

Figure 1H:
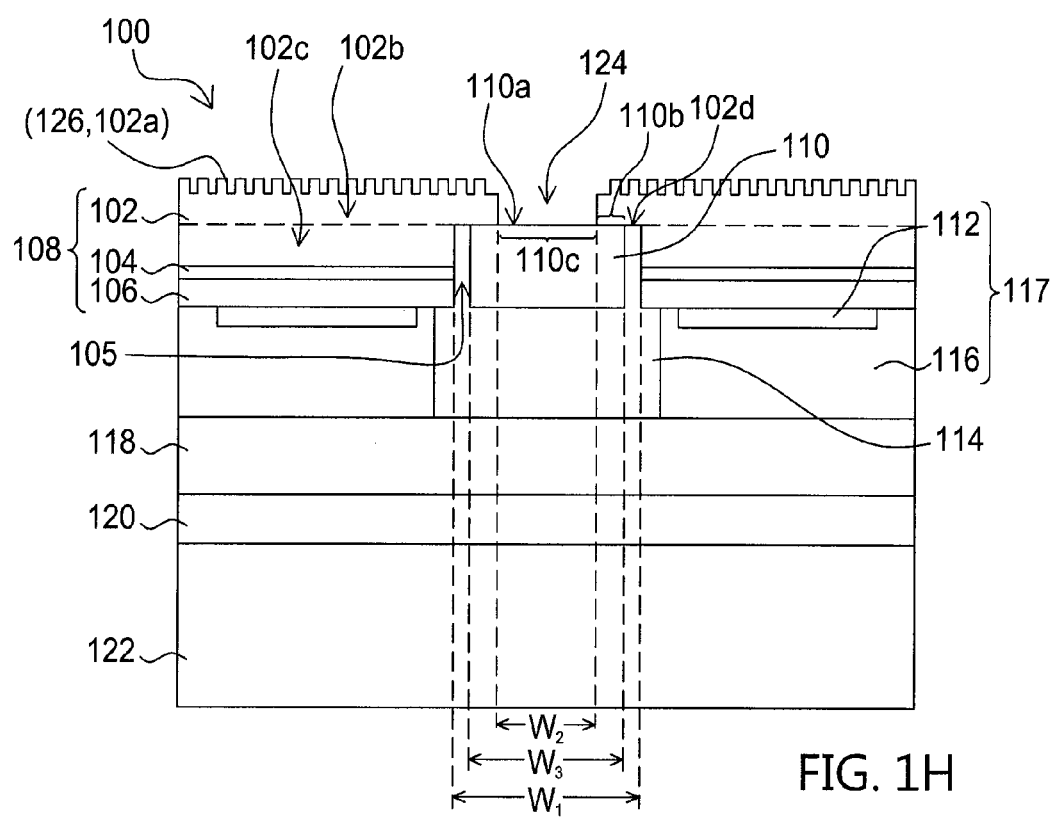

Referring to FIG. 1H, a roughed structure 126 is formed on the first surface 102a of the first semiconductor layer 102 by etching. The roughed structure 126 can have a regular or irregular rough surface with a roughness of 0.5~1 µm, and an opening 124 is formed by removing a portion of the first semiconductor layer 102 which is on the electrode 110. The depression 105 has width W1 greater than a width W2 of the opening 124, and therefore, after the depression 105 and the opening are formed in sequence, a second surface 102d opposite to the first surface 102a is formed at the bottom of the first semiconductor layer 102 connecting to the depression 105, and the electrode 110 connects to the second surface 102d and is formed in the depression 105 corresponding to the opening 124 wherein the electrode has a width W3 greater than the width W2. The upper surface 110a of the electrode 110 has a contact area 110b connecting to the second surface 102d of the first semiconductor layer 102 and an exposed area 110c exposed by the opening 124. A thickness of the first semiconductor 102 can be 3~4 µm while the first semiconductor 102 has a first portion 102b and a second portion 102c. The thickness of the first portion 102b is about equal to the depth of the opening 124, which is about 1.5~3 µm. The thickness of the second portion 102c corresponding to the depression 105 is about 1~1.5 µm. Because the electrode 110 electrically connects to the first semiconductor layer 102 while is not formed on the first surface 102a, the electrode 110 does not shield the light from the light-emitting device 100.

With the abovementioned processes, the light-emitting device 100 disclosed in the embodiment includes the conductive substrate 122; the joining structure 120 formed on the conductive substrate 122; the reflective layer 118 formed on the joining structure 120; the conductive structure 117 including the barrier 116 formed on a portion of the reflective layer 118, and the conductive layer 112 covered by the barrier 116; the light-emitting stack 108 including the first semiconducting layer 102, the active layer 104, and the second semiconducting layer 106 electrically connecting with the conductive layer 112; the insulative structure 114 formed on a portion of the reflective layer 118 and penetrating the second semiconducting layer 106, the active layer 104, and the second part 102c of the first semiconducting layer 102; the electrode 110 covered by the insulative structure 124 wherein the upper surface 110a of the electrode 110 connects to the first semiconducting layer 102; and the opening 124 penetrating the first portion 102b of the first semiconducting layer 102. Herein, the insulative structure 114 insulates the electrode 110 from the second semiconductor 106 and the active layer 104, and the electrode 110 and the active layer 104 are on different regions along the horizontal direction of the light-emitting device 100 while the whole active layer 104 is located above the conductive structure 117. Therefore, the light from the active layer 104 is not shielded by the electrode 110 of the light-emitting device 100 and the conductive structure 117. The upper surface 110a of the electrode 110 can be connected with an external power source.

Figure 2:
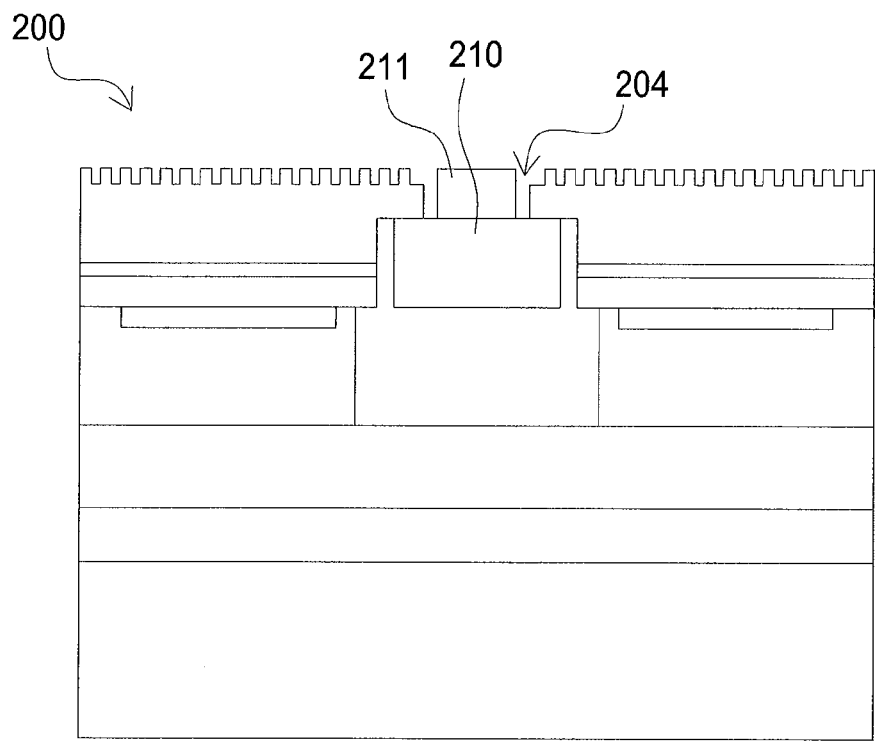
FIG. 2 illustrates a light-emitting device in accordance with a second embodiment of the application.

FIG. 2 illustrates a light-emitting device in accordance with a second embodiment of the application. The second embodiment and the first embodiment are similar, but the difference between them is that a wiring electrode 211 is formed on an electrode 210 and the wiring electrode 211 is in an opening 204 for a soldering ball for wiring (not shown in FIG. 2).

Figure 3:
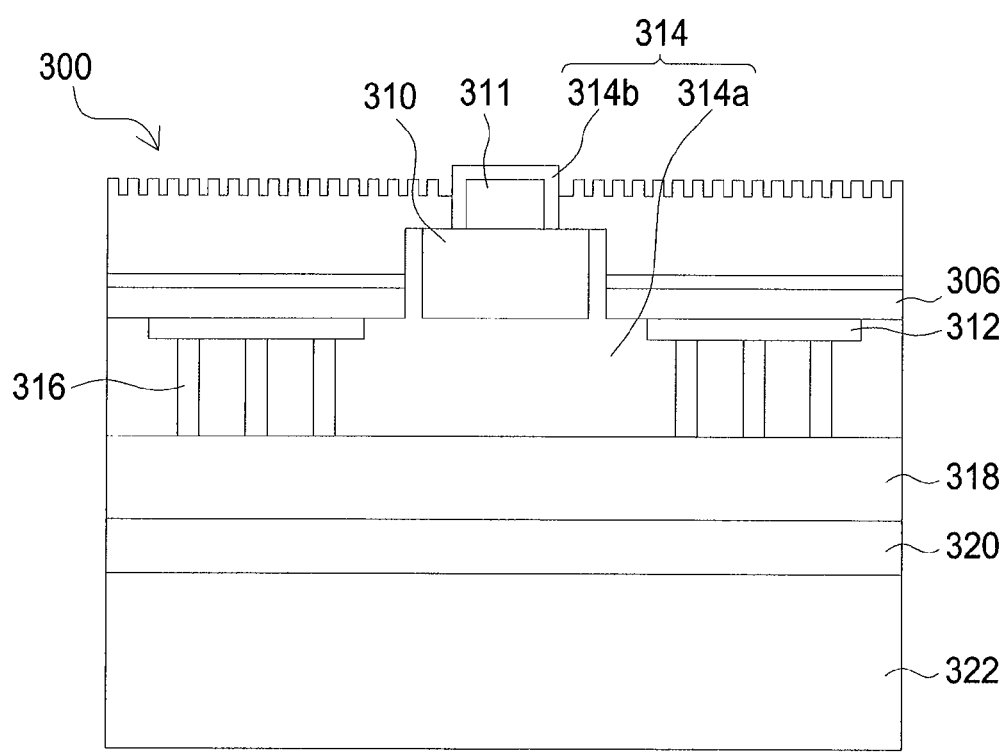
FIG. 3 illustrates a light-emitting device in accordance with a third embodiment of the application.

FIG. 3 illustrates a light-emitting device in accordance with a third embodiment of the application. The third embodiment is similar to the aforementioned embodiments, but the differences between them are mentioned as follows. A conductive layer 312 which electrically connects with a second semiconductor layer 306 is a transparent conductive layer without reflectivity, such as indium tin oxide (ITO), indium zinc oxide (IZO), or aluminum-doped zinc oxide (AlZO), and there is no barrier as shown in the first embodiment. An insulative structure 314 can include an insulative layer 314a between an electrode 310 and a reflective layer 318, and an insulative portion 314b covers the wiring electrode 311. A plurality of conductive channels 316 penetrates the insulative layer 314a and connects the conductive layer 312 and the reflective layer 318 by its two ends respectively. A joining structure 320 and a conductive substrate 322 same as those described in the first embodiment are below the reflective layer 318. The conductive channel 316 can be a metal well to fill pores like titanium (Ti), aluminum (Al), nickel (Ni), chromium (Cr), or copper (Cu). The insulative structure 314 can be a transparent insulative material and is formed by evaporating, sputtering, or spin-on glass (SOG) to form single-layer of $SiO_2$, single-layer of $TiO_2$, or single-layer of $Si_3N_4$, and then solidifying or alternatively stacking two different films with different index of refraction to form a distributed Bragg reflector (DBR).

Figure 4:
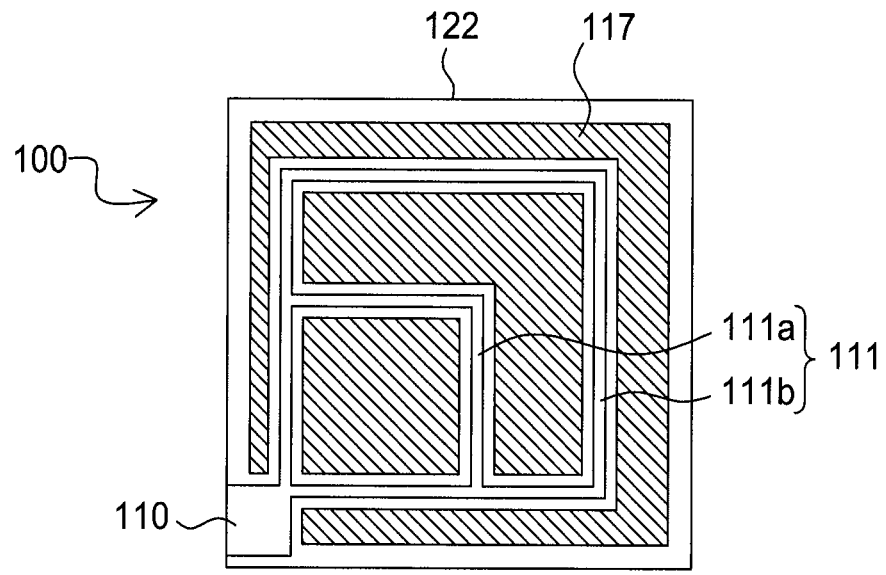
FIG. 4 illustrates an electrode layout of the light-emitting device in accordance with the first embodiment of the application.

FIG. 4 illustrates an electrode layout of the light-emitting device in accordance with the first embodiment of the application. The electrode layout can also be utilized in the second embodiment and the third embodiment. In the embodiment, it shows only patterns of the electrode 110 and the conductive structure 117 for clearly showing the pattern of the electrode. From top view, the conductive substrate 122 of the light-emitting device 100 is a rectangle with a size of 1 mil to 70 mils. The electrode disclosed in the embodiment includes a wiring electrode 110 and an extensive electrode 111 extending from the wiring electrode 110. The wiring electrode 110 is located near a corner of the rectangle of the light-emitting device 100, and the extensive electrode 111 includes a first extensive electrode 111b along outer edges of the light-emitting device 100 and a second extensive electrode 111a surrounding by and connecting to the first extensive electrode 111b. The first extensive electrode 111b and the second electrode 111a form another rectangle. The wiring electrode 110, and/or the extensive electrode 111, and the conductive structure 117 are formed on different regions of the conductive substrate 122 and do not overlap with one another. Therefore, the conductive structure 117 as shown in the region with slash lines substantially complements the patterns of the wiring electrode 110 and the extensive electrode 111.

Figure 5:
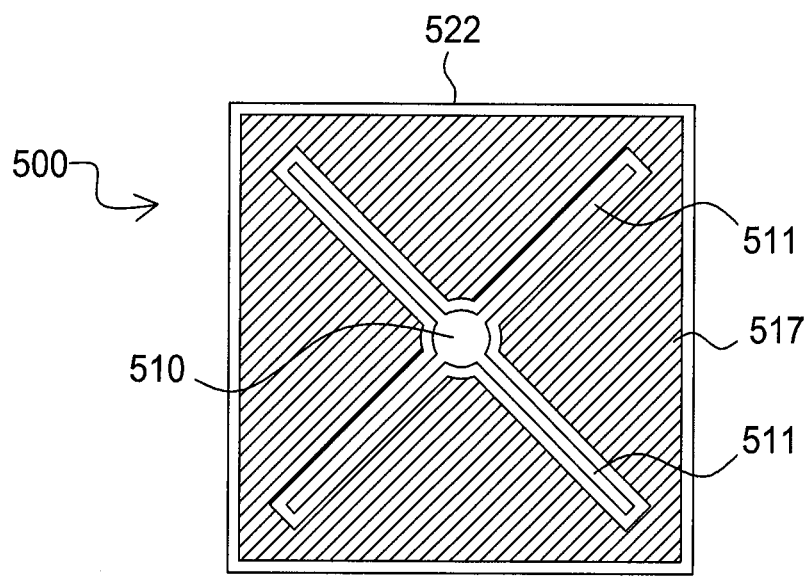
FIG. 5 illustrates an electrode layout of the light-emitting device in accordance with the forth embodiment of the application.

FIG. 5 shows an electrode layout of a light-emitting device in accordance with a fourth embodiment of the application. The electrode layout can be utilized in the first embodiment to the third embodiment. FIG. 5 illustrates only the electrodes and the conductive structure of the above-mentioned embodiment for clearly showing patterns on the electrodes. From top view, a conductive substrate 522 of a light-emitting device 500 is a rectangle. The electrodes shown in the embodiment include a wiring electrode 510 and an extensive electrode 511 extending from the wiring electrode 510. The wiring electrode 510 is substantially located at a geometric center of the light-emitting device 500 and the extensive electrode 511 optionally includes a plurality of radial branches extending from the wiring electrode 510. The wiring electrode 510, and/or the extensive electrode 511, and a conductive structure 517 are formed on different regions of the conductive substrate 522 and do not overlap with one another. Therefore, the conductive structure 517 as shown in the region with slash lines substantially complements the pattern formed by the wiring electrode 510 and the extensive electrode 511.

Figure 6:
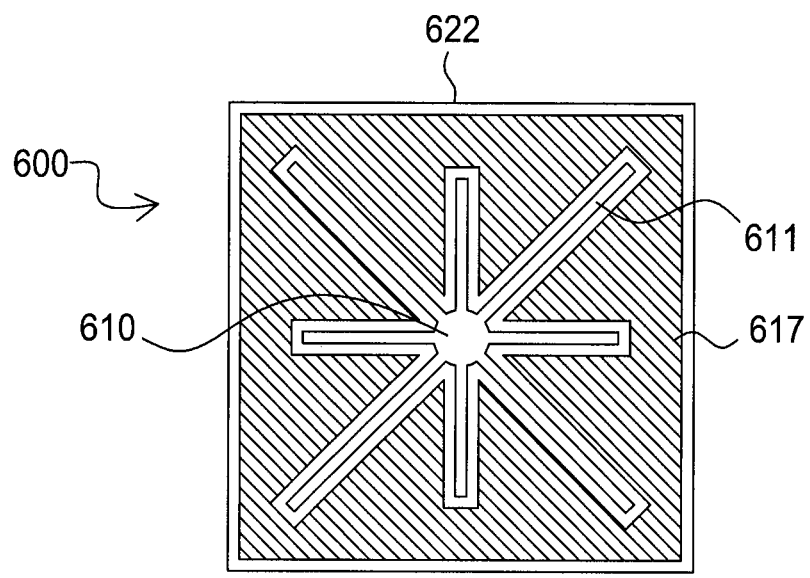
FIG. 6 illustrates an electrode layout of the light-emitting device in accordance with a fifth embodiment of the application.

FIG. 6 shows an electrode layout of a light-emitting device in accordance with a fifth embodiment of the application. The electrode layout can be utilized in the first embodiment to the third embodiment. From top view, a conductive substrate 622 of a light-emitting device 600 is a rectangle. The electrodes disclosed in the embodiment include a wiring electrode 610 and an extensive electrode 611 extending from the wiring electrode 610. The wiring electrode 610 is substantially located at a geometric center of the light-emitting device 600 and the extensive electrode 611 includes a plurality of radial branches extending from the wiring electrode 610. In comparison with the fifth embodiment, there are more radial branches in the embodiment and lengths of the radial branches vary with their extended directions. For example, a length of the radial branch of the extensive electrode 611 along a diagonal of the rectangle of the light-emitting device 600 is longer than a length of the radial branch along a side of the rectangle. The wiring electrode 610, and/or the extensive electrode 611, and a conductive structure 617 are formed on different regions of the conductive substrate 622 and do not overlap with one another. Therefore, the conductive structure 617 as shown in the region with slash lines complements the pattern formed by the wiring electrode 610 and extensive electrode 611.

Figure 7:
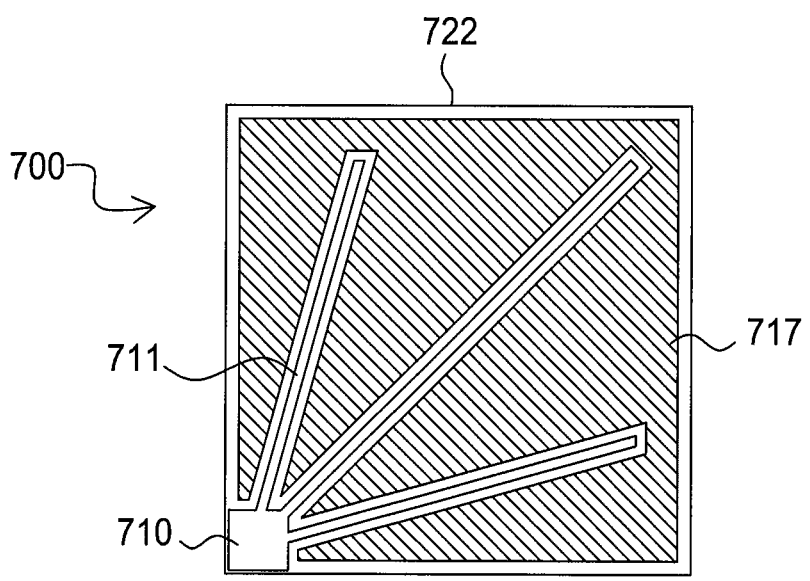
FIG. 7 illustrates an electrode layout of the light-emitting device in accordance with a sixth embodiment of the application.

FIG. 7 illustrates an electrode layout of a light-emitting device in accordance with a sixth embodiment of the application. The electrode layout can be utilized in the first embodiment to the third embodiment. From top view, a conductive substrate 722 of a light-emitting device 700 is a rectangle. The electrodes disclosed in the embodiment include a wiring electrode 710 and an extensive electrode 711 extending from the wiring electrode 710. The wiring electrode 710 is substantially located at a corner of the rectangle of the light-emitting device 700, and the extensive electrode 711 includes a plurality of radial branches extending from the wiring electrode 710 with lengths that vary with their extensive angles respectively. The wiring electrode 710, and/or the extensive electrode 711, and a conductive structure 717 are formed on different regions of the conductive substrate 722 and do not overlap with one another. Therefore, the conductive structure 717 as shown in the region with slash lines substantially complements the pattern formed by the wiring electrode 710 and extensive electrode 711.

Figure 8:
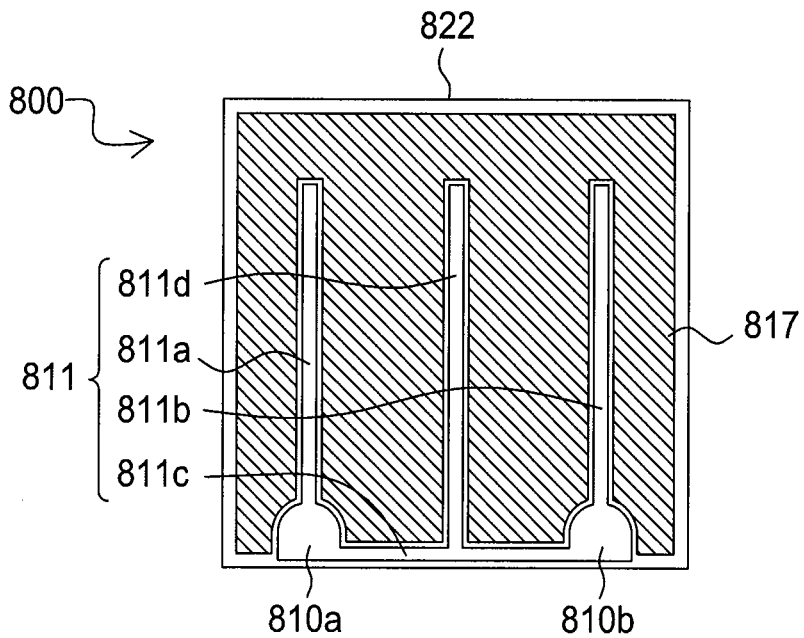
FIG. 8 illustrates an electrode layout of the light-emitting device in accordance with a seventh embodiment of the application.

FIG. 8 illustrates an electrode layout of a light-emitting device in accordance with a seventh embodiment of the application. The electrode layout can be utilized in the first embodiment to the third embodiment. From top view, a conductive substrate 822 of a light-emitting device 800 is a rectangle. The electrodes disclosed in the embodiment include wiring electrodes 810a and 810b near a side of the rectangle of the light-emitting device 800, an extensive electrode 811 including radial branches 811a and 811b extending from the wiring electrode 810a and 810b to another side of the rectangle, a radial branch 811c connecting to the wiring electrodes 810a and 810b by its two ends and parallel to a side of the rectangle, and a radial branch 811d extending from the radial branch 811c and parallel to the radial branches 811a and 811b. The wiring electrode 810a and 810b, and/or the extensive electrode 811, and the conductive structure 817 are formed on different regions of the conductive substrate 822 and do not overlap with one another, and therefore the conductive structure 817 as shown in the region with slash lines substantially complements the patterns of the wiring electrode 810a and 810b and extensive electrode 811.

Figure 9:
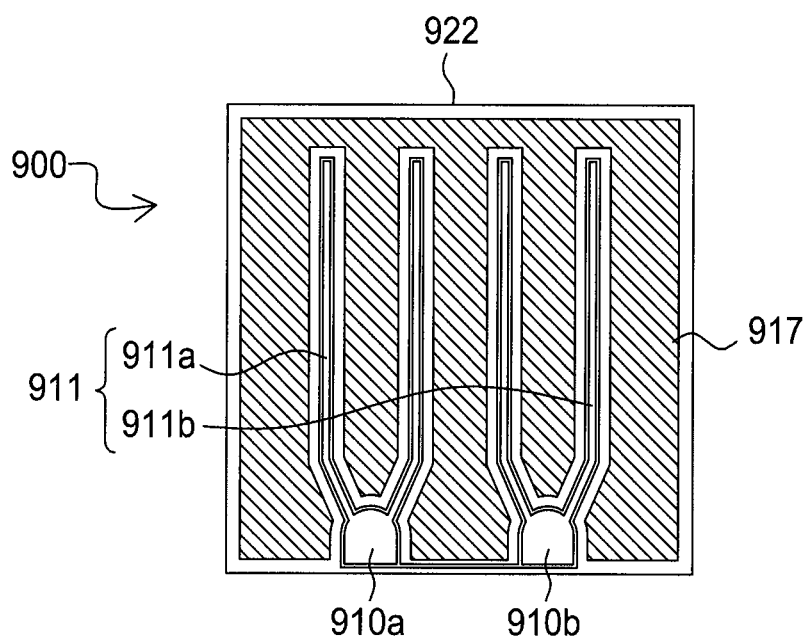
FIG. 9 illustrates an electrode layout of the light-emitting device in accordance with an eighth embodiment of the application.

FIG. 9 it illustrates an electrode layout of a light-emitting device in accordance with an eighth embodiment of the application. The electrode layout can be utilized in the first embodiment to the third embodiment. From top view, a conductive substrate 922 of a light-emitting device 900 is a rectangle. The electrodes disclosed in the embodiment include wiring electrodes 910a and 910b near a side of the rectangle of the light-emitting device 900 and an extensive electrode 911 including radial branches 911a and 911b extending from the wiring electrodes 910a and 910b to another side of the rectangle. The embodiment is similar to the seventh embodiment, but the differences include that the radial branches 911a and 911b are sinuous and extending from the wiring electrodes 910a and 910b, and there are multiple radial branches 911a and 911b extended from the wiring electrodes 910a and 910b respectively. The wiring electrode 910, and/or the extensive electrode 911, and the conductive structure 917 are formed on different regions of the conductive substrate 922 and do not overlap with one another. Therefore, the conductive structure 917 as shown in the region with slash lines substantially complements the patterns of the wiring electrode 910 and extensive electrode 911.

Figure 10:
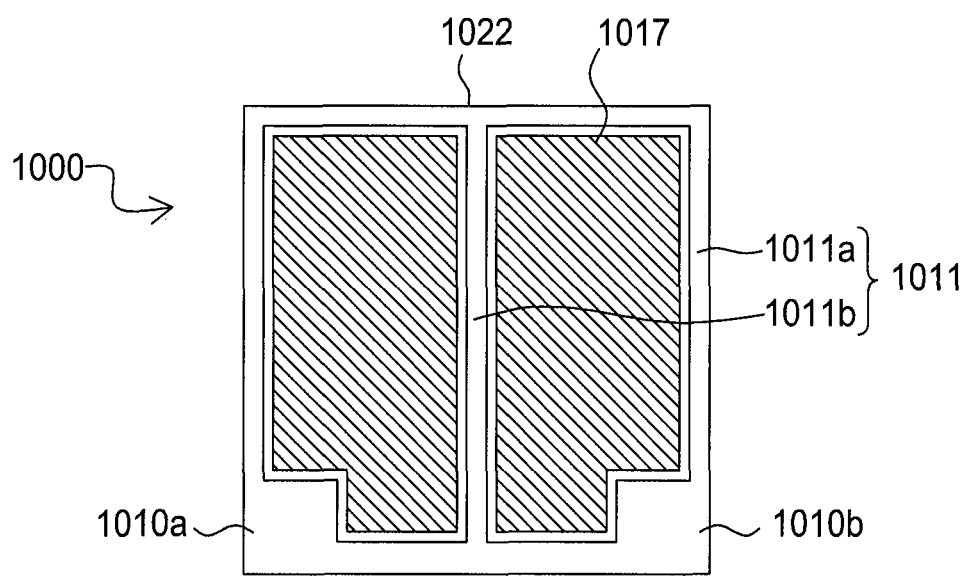
FIG. 10 illustrates an electrode layout of the light-emitting device in accordance with a ninth embodiment of the application.

FIG. 10 illustrates an electrode layout of a light-emitting device in accordance with a ninth embodiment of the application. The electrode layout can be utilized in the first embodiment to the third embodiment. From top view, a conductive substrate 1022 of the light-emitting device is a rectangle. The electrodes disclosed in the embodiment include two wiring electrodes 1010a and 1010b near two corners of the rectangle of the conductive substrate 1022, and an extensive electrode 1011 including a first radial branch 1011a along the rectangle of the conductive substrate 1002 and connecting to the wiring electrodes 1010a and 1010b, and a second radial branch 1011b connecting to two opposite sides of the rectangle of the first radial branch 1011a and forming a net pattern with the first radial branch 1011a. The wiring electrode 1010, and/or the extensive electrode 1011, and the conductive structure 1017 are formed on different regions of the conductive substrate 1022 and do not overlap with one another. Therefore, the conductive structure 1017 as shown in the region with slash lines substantially complements the patterns of the wiring electrode 1010 and extensive electrode 1011.

Figure 11:
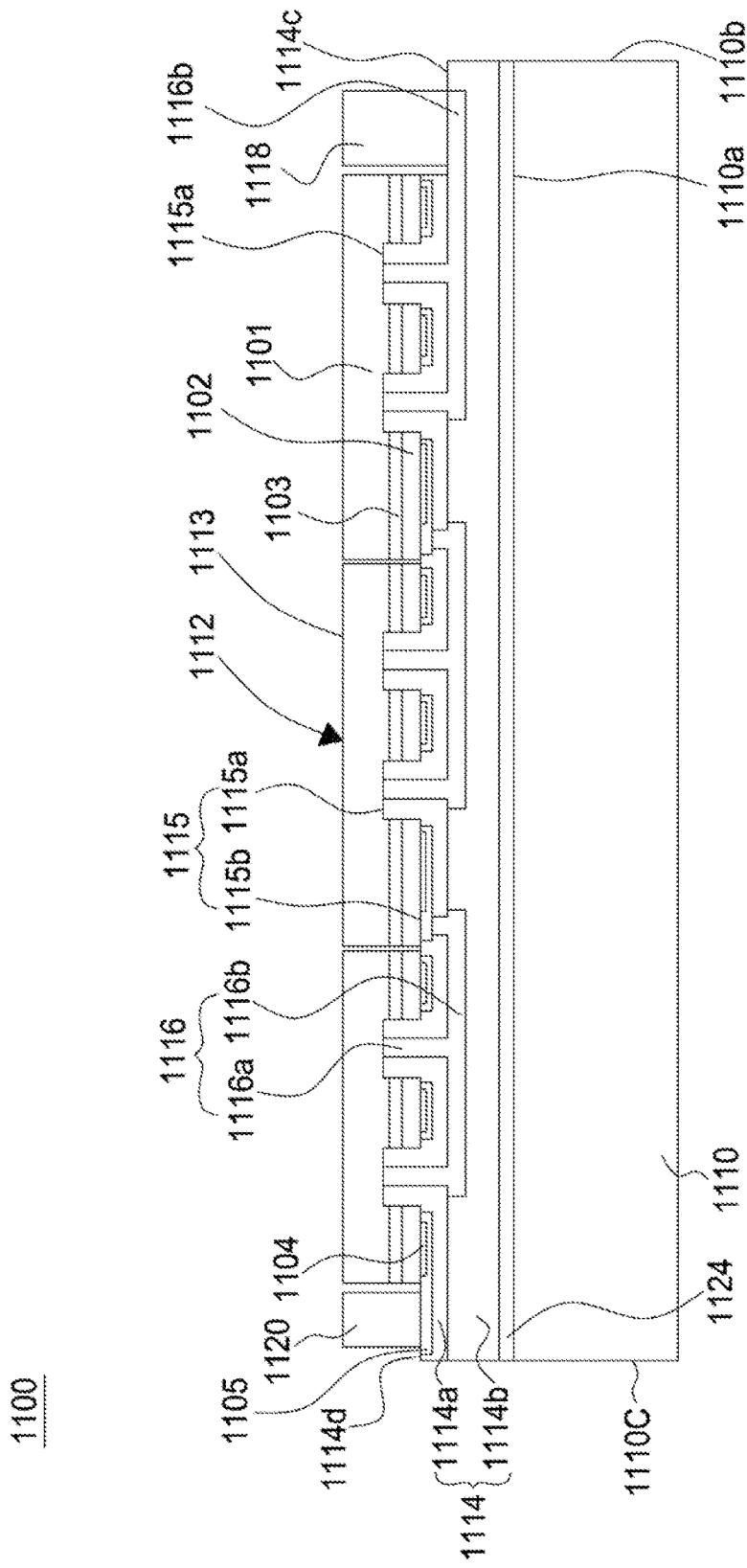
FIG. 11 illustrates a light-emitting array in accordance with a tenth embodiment of the application.

FIG. 11 illustrates a light-emitting array 1100 in accordance with a tenth embodiment of the application. The light-emitting array 1100 includes an insulative substrate 1110 including an upper surface 1110a, a first side surface 1110b and a second side surface 1110c, wherein the upper surface 1110a is between the first side surface 1110b and the second side surface 1110c, a joining layer 1124 formed on the upper surface 1110a and being insulative, an insulative layer 1114 formed on the joining layer 1124, a plurality of light-emitting units 1112 formed on the insulative layer 1114, wherein each of the light-emitting units 1112 includes a first surface 1113 and a second surface 1115. The first surface 1113 has a first polarity, and the second surface 115 is toward to the insulative substrate 1110 opposite to the first surface 1113 and includes a first region 1115a with the first polarity and a second region 1115b with a second polarity. A plurality of wires 1116 is embedded in the insulative layer 1114 and electrically connecting with two of the light-emitting units 1112, for example, connecting to the second region 1115b of at least one of the light-emitting units 1112 and the first region 1115a of another one of the light-emitting units 1112. A first electrode 1118 is formed on the insulative layer 1114, electrically connecting with the first region 1115a of one of the light-emitting units 1112, and located in different region than that of the light-emitting units 1112 on the insulative layer 1114. A second electrode 1120 is formed on the insulative layer 1114, electrically connecting with the second region 1115b of one of the light-emitting units 1112, and located in different region than that of the light-emitting units 1112 on the insulative layer 1114.

The light-emitting units 1112 are epitaxially grown on the same wafer (not shown in figures). After epitaxially growth, the first surface 1113 connects to the wafer and the second surface 1115 faces up. The first region 1115a and the second region 1115b of the second surface 1115 can be defined by an etching process as the light-emitting units 1112 are not defined yet. After carrying the light-emitting unit 1112 on the insulative substrate 1110 via the joining layer 1124, the wafer can be removed and the first surface 1113 is exposed. In sequence, a plurality of the light-emitting units 1112 electrically insulated from one another can be formed from the first surface 1113 by an etching process. Additionally, the first surface 1113 similar to the one in the first embodiment is a rough surface.

The insulative layer 1114 can include a second insulative layer 1114a and a first insulative layer 1114b and is made of silicon oxide SiO$_2$, for example. The second insulative layer 1114a can cover the first region 1115a and the second region 1115b of the second surface 1115 to form a surface substantially parallel to the upper surface 1110a of the insulative substrate 1110. The wire 1116 includes a conductive channel 1116a penetrating the second insulative layer 1114a for electrically connecting with the first region 1115a or the second region 1115b, and a bridge 1116b laterally extending along a surface of the second insulative layer 1114a and connecting to the conductive channels 1116a of the neighboring light-emitting units 1112. The bridge 1116b can connect to identical/different polarities of two different light-emitting units 1112 for forming a serial/parallel/in inverse-parallel connection. The first insulative layer 1114b can cover the second insulative layer 1114a and the bridge 1116b.

The light-emitting unit 1112 includes a first semiconductor layer 1101 having the first surface 1113 and the first region 1115a of the second surface 1115, a second semiconductor layer 1102 having the second region 1115b of the second surface 1115, and an active layer 1103 between the first semiconductor layer 1101 and the second semiconductor layer 1102. The first semiconductor layer 1101 has the first polarity and the second semiconductor layer 1102 has the second polarity different from the first polarity. In the embodiment, the first polarity of the first semiconductor layer 1101 is n-type; the second polarity of the semiconductor layer 1102 is p-type. The first region 1115a of the second surface 1115 is farther from the insulative substrate 1110 than the second region 1115b to expose the first semiconductor layer 1101. The insulative layer 1114 covers the second surface 1115 and fills a convex-concave structure formed by the first region 1115a and the second region 1115b. There can be multiple first regions 1115a of the light-emitting unit 1112 which connect to a plurality of the conductive channels 1116a, and lateral sides of the conductive channels 1116a which connect to the first regions 1115a are covered by the second insulative layer 1114a so as to be electrically insulated from the second region 1115b of the second semiconductor 1102 of the individual light-emitting unit 1112. Similar to the first embodiment, a conductive layer 1104 with reflectivity and a barrier 1105 covering the conductive layer 1104 can be formed on the second region 1115b. The first electrode 1118 can electrically connect with the first region 1115a of the light-emitting unit 1112 via the bridge 1116b; the second electrode 1120 can electrically connect with the second region 1115b of the light-emitting unit 1112 via the barrier 1105. The bridge 1116b connecting to the first electrode 1118 is co-planar with a first exposing surface 1114c of the first insulative layer 1114b; the barrier 1105 connecting to the second electrode 1120 is co-planar with a second exposing surface 1114d of the second insulative layer 1114a wherein the first exposing surface 1114c is closer to the insulative substrate 1110 than the second exposing surface 1114d. A light-emitting array 1100 including a circuit in series/in parallel/in inversed-parallel can be formed between the first electrode 1118 and the second electrode 1120.

Light from each of the light-emitting unit 1112 emits out of the first surface 1113, the wires 1116 are located below all of the light-emitting units 1112, and the first electrode 1118 and the second electrode 1120 are side by side with all of the light-emitting units 1112. Accordingly, the light is not shaded by the wires 1116, the first electrode 1118, and the second electrode 1120 disclosed in the embodiment.

Figure 12:
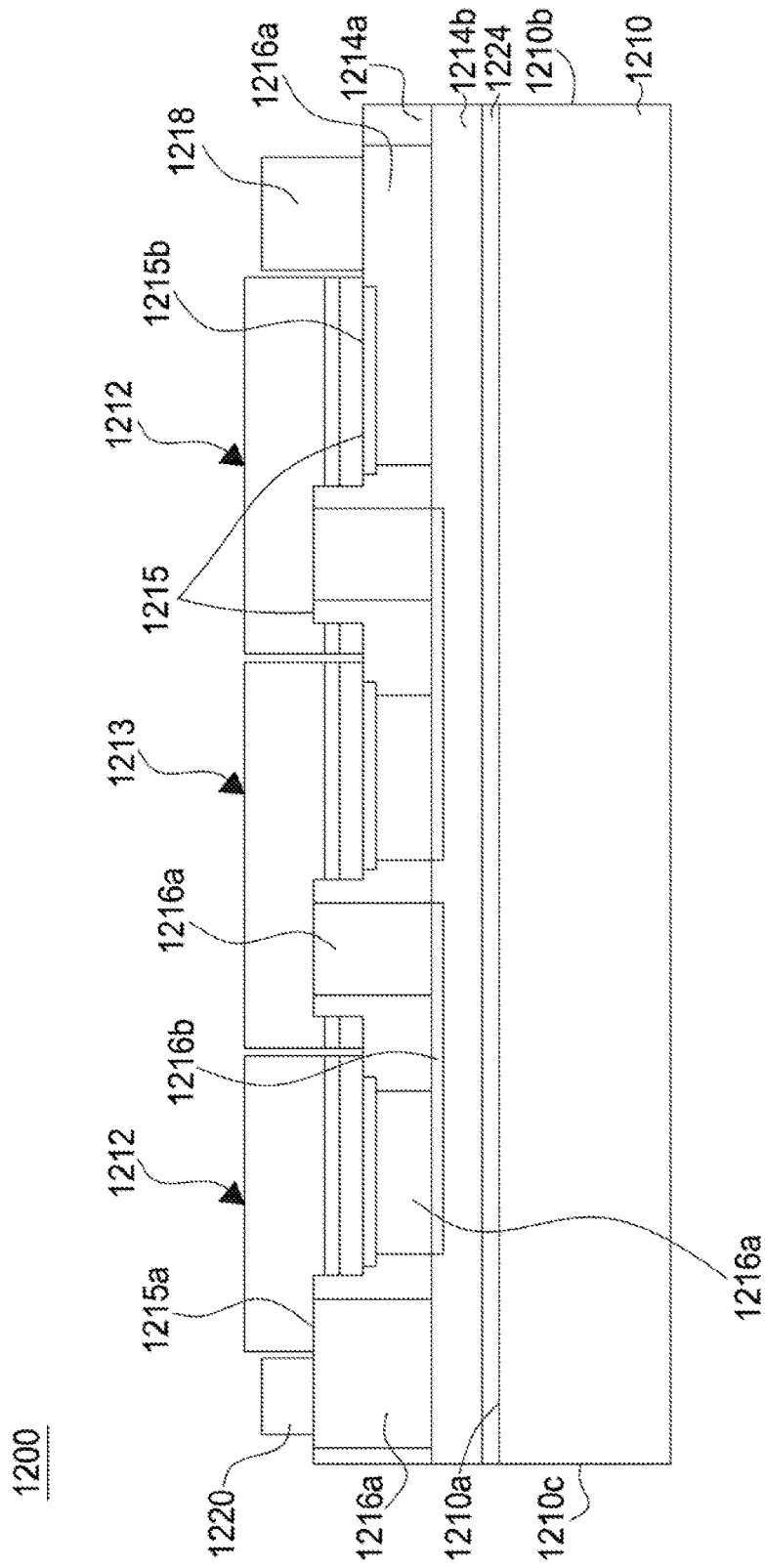
FIG. 12 illustrates a light-emitting array in accordance with an eleventh embodiment of the present application.

FIG. 12 illustrates a light-emitting array 1200 in accordance with an eleventh embodiment of the application. The light-emitting array 1200 includes an insulative substrate 1210 including an upper surface 1210a, a first side surface 1210b and a second side surface 1210c, wherein the upper surface 1210a is between the first side surface 1210b and the second side surface 1210c, a joining layer 1224 formed on the upper surface 1210a and being insulative, insulative layers 1214a and 1214b formed on the joining layer 1224, a plurality of light-emitting units 1212 formed on the insulative layers 1214a and 1214b, wherein each of the light-emitting units 1212 includes a first surface 1213 and a second surface 1215. The second surface 1215 includes a first region 1215a of a first semiconductor layer and a second region 1215b of a second semiconductor layer. The embodiment is similar to the tenth embodiment but the differences are as follows. Each of light-emitting units 1212 disclosed in the embodiment is similar to those in the first embodiment, the first region 1215a and the second region 1215b can have patterns as shown in FIG. 4 to FIG. 10. The first region 1215a of each of the light-emitting units 1212 has only a conductive channel 1216a connecting to a bridge 1216b, and a cross section of the conductive channel 1216a is bigger than that of the tenth embodiment, wherein two of the conductive channels 1216a respectively electrically connect with the first region 1215a of one of the light-emitting unit 1212 and the second region 1215b of another one of the light-emitting unit 1212 and extend to a surface of a first insulative layer 1214b devoid of the light-emitting units 1212. A first electrode 1218 and a second electrode 1220 can be formed on two of the conductive channels 1216a. The Alight-emitting array 1200 including a circuit in series/in parallel/in inversed-parallel can be formed between the first electrode 1218 and the second electrode 1220.

Figure 13:
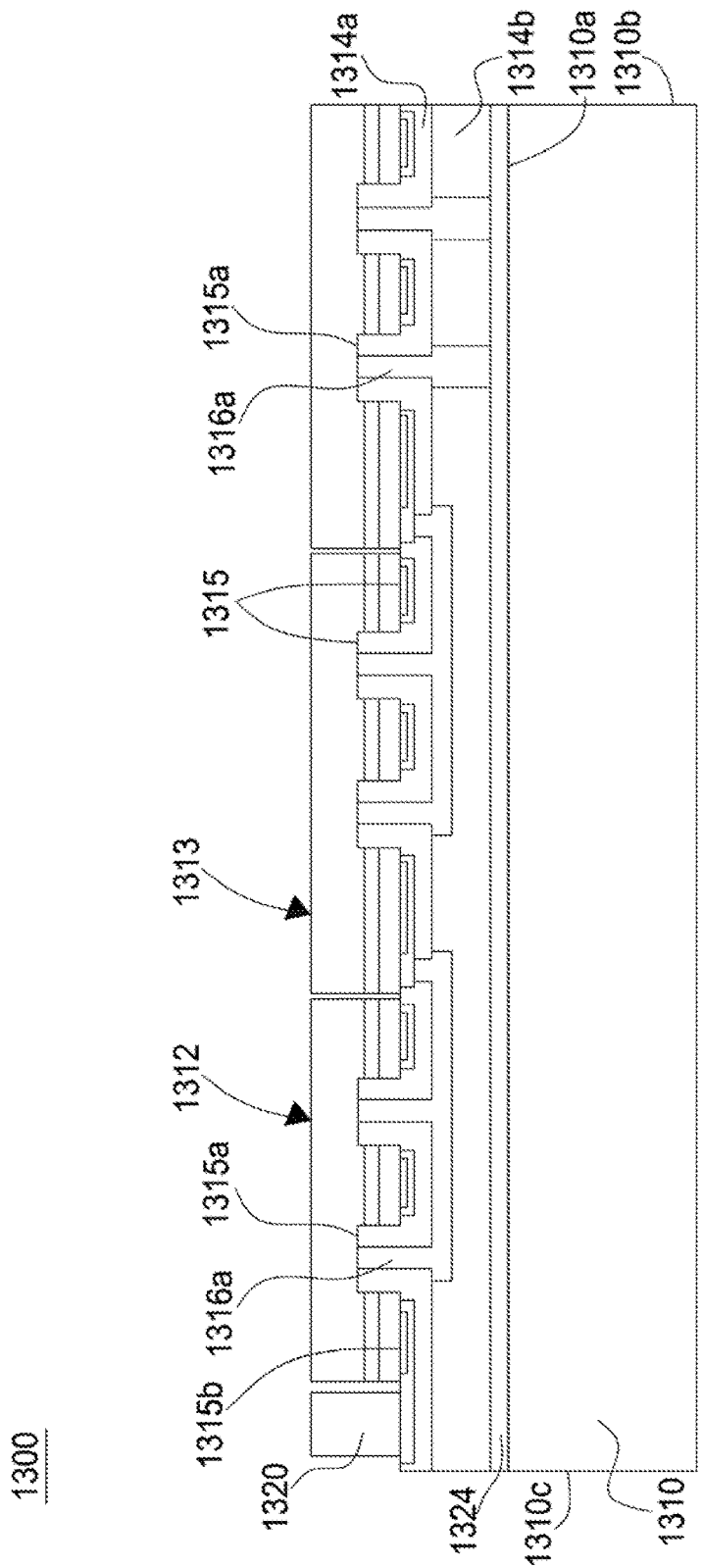
FIG. 13 illustrates a light-emitting array in accordance with a twelfth embodiment of the application.

FIG. 13 illustrates a light-emitting array 1300 in accordance with a twelfth embodiment of the application. The embodiment is similar to the tenth embodiment but the differences are as follows. A conductive substrate 1310 disclosed in the embodiment replaces the insulative substrate 1110 disclosed in the tenth embodiment, wherein the conductive substrate 1310 includes a first side surface 1310b, a second side surface 1310c, and an upper surface 1310a between the first side surface 1210b and the second side surface 1210c; a conductive joining layer 1324 replaces the insulative joining layer 1124 disclosed the tenth embodiment. A plurality of light-emitting units 1312 is formed on insulative layers 1314a and 1314b, wherein each of the light-emitting units 1312 includes a first surface 1313 and a second surface 1315. The second surface 1315 includes a first region 1315a of a first semiconductor layer and a second region 1315b of a second semiconductor layer. Additionally, conductive channels 1316a are connected to the first region 1315a of the light-emitting unit 1312, penetrate a second insulative layer 1314a and a first insulative layer 1314b, and electrically connect with a conductive joining layer 1324. An electrode 1320 electrically connects with the second region 1315b of the light-emitting unit 1312, and the light-emitting array 1300 including a circuit in series/in parallel/in inverse-parallel can be formed between the electrode 1320 and the conductive substrate 1310. As the tenth embodiment recited, the first region 1315a has the n-type polarity and the second region 1315b has the p-type polarity. Accordingly, for the embodiment, the n-type polarity is conducted to the conductive substrate 1310. In other embodiments, the p-type polarity can be conducted to the conductive substrate 1310. The material of the conductive substrate 1310 can be referred those disclosed in the first embodiment.

Figure 14:
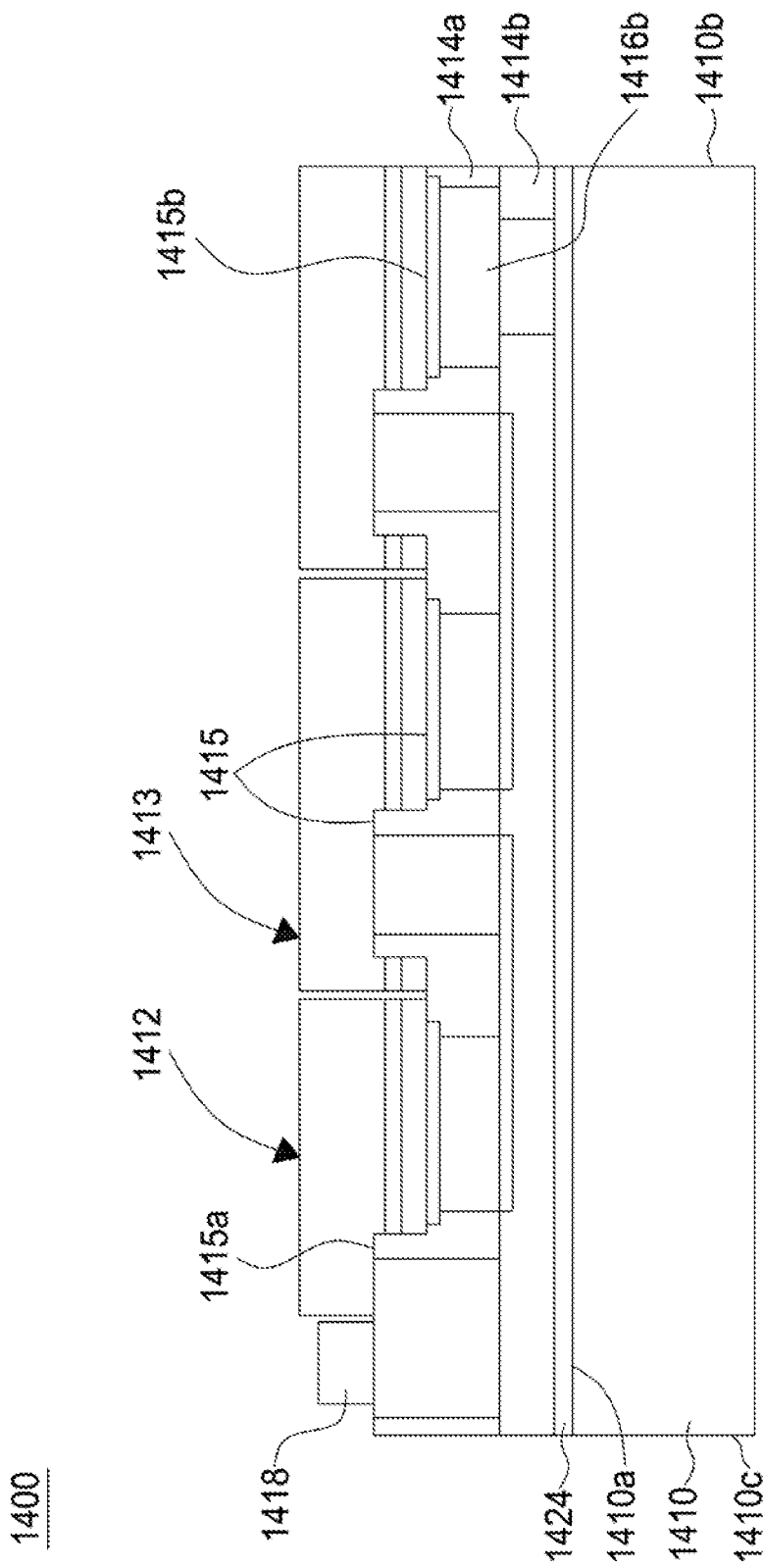
FIG. 14 illustrates a light-emitting array in accordance with a thirteenth embodiment of the application.

FIG. 14 illustrates a light-emitting array 1400 in accordance with a thirteenth embodiment of the application. The embodiment is similar to the eleventh embodiment but the differences are as follows. A conductive substrate 1410 disclosed in the embodiment replaces the insulative substrate 1110 of the eleventh embodiment, wherein the conductive substrate 1410 includes a first side surface 1410b, a second side surface 1410c, and an upper surface 1410a between the first side surface 1410b and the second side surface 1410c, and a conductive joining layer 1424 disclosed in the embodiment replaces the joining layer 1110a of the eleventh embodiment. A plurality of light-emitting units 1412 is formed on insulative layers 1414a and 1414b, wherein each of the light-emitting units 1412 includes a first surface 1413 and a second surface 1415. The second surface 1415 includes a first region 1415a of a first semiconductor layer and a second region 1415b of a second semiconductor layer. A conductive channel 1416b connects to a second region 1415b of a light-emitting unit 1412, penetrates a second insulative layer 1414a and a first insulative layer 1414b, and electrically connects with a conductive joining layer 1424. An electrode 1418 electrically connects with a first region 1415a of the light-emitting unit 1412 and the light-emitting array 1400 including a circuit in series/in parallel/in inverse-parallel can be formed between the electrode 1418 and the conductive substrate 1410. As the tenth embodiment recited, the first region 1415a has the n-type polarity and the second region 1415b has the p-type polarity. Accordingly, in the embodiment, the p-type polarity is conducted to the conductive substrate 1410; in other embodiments, the n-type polarity can be conducted to the conductive substrate 1410. The material of the conductive substrate 1410 can be referred to those disclosed in the first embodiment.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a substrate comprising an upper surface, a first side surface, and a second side surface, wherein the upper surface is between the first side surface and the second side surface, in a cross-sectional view;
   a plurality of light-emitting units disposed on the upper surface of the substrate, wherein each of the light-emitting units comprises a first surface and a second surface between the upper surface and the first surface, wherein each of the plurality of light-emitting units comprises a first semiconductor layer, a second semiconductor layer and an active layer between the first semiconductor layer and the second semiconductor layer;
   a plurality of depressions disposed in adjacent two of the plurality of light-emitting units respectively;
   a first insulative layer covering the second surface of the light-emitting stack and between the substrate and the light-emitting stack;
   a plurality of conductive channels disposed in the plurality of depressions, respectively and electrically connected with the plurality of light-emitting units by contacting the second surface of each of the light-emitting units;
   a bridge disposed between the first insulative layer and the plurality of light-emitting units and connected with the plurality of conductive channels;
   an opening extending from the first surface of one of the light-emitting units, connecting one of the plurality of depressions disposed near the first side surface of the substrate, and exposing one of the conductive channels disposed in the one of the plurality of depressions;

a first electrode disposed in the opening and only connecting the one of the conductive channels; and a conductive joining layer disposed between the first insulative layer and the substrate;

wherein the second surface comprises a first region of a surface of the first semiconductor layer and a second region of a surface of the second semiconductor layer, the second region nearer the upper surface than the first region, and the first electrodes is located outside each of the light-emitting units and electrically connects the first region;

wherein the second region is electrically connected to the conductive joining layer.

2. The light-emitting device of claim 1, wherein a top surface of the first electrode and the first surface of each of the light-emitting unit are coplanar.

3. The light-emitting device of claim 1, further comprising a second insulative layer, wherein the second insulative layer is formed in the plurality of depressions and connects the plurality of conductive channels, and the bridge is disposed between the first insulative layer and the second insulative layer.

4. The light-emitting device of claim 3, wherein the bridge is parallel to the conductive joining layer.

5. The light-emitting device of claim 1, further comprising:

a second electrode, wherein the second electrode electrically connects the second region.

6. The light-emitting device of claim 1, wherein each of the light-emitting units comprises a plurality of the first regions and each of the first regions connects to the bridge.

* * * * *